United States Patent [19]
Timko

[11] Patent Number: 5,684,487
[45] Date of Patent: Nov. 4, 1997

[54] A/D CONVERTER WITH CHARGE-REDISTRIBUTION DAC AND SPLIT SUMMATION OF MAIN AND CORRECTING DAC OUTPUTS

[75] Inventor: Michael P. Timko, Andover, Mass.

[73] Assignee: Analog Devices, Incorporated, Norwood, Mass.

[21] Appl. No.: 461,189

[22] Filed: Jun. 5, 1995

[51] Int. Cl.$^6$ ................................................. H03M 1/12
[52] U.S. Cl. ............................................ 341/172; 341/120
[58] Field of Search ...................................... 341/172, 118, 341/120, 121, 144, 150, 155

[56] References Cited

U.S. PATENT DOCUMENTS 4,399,426  8/1983  Tan .
4,947,169  8/1990  Smith et al. ................................ 341/121

Primary Examiner—Brian K. Young
Attorney, Agent, or Firm—Parmelee & Bollinger, LLP

[57]   ABSTRACT

An analog-to-digital (A/D) converter of the successive-approximation type wherein the digital-to-analog converter (DAC) includes a charge-redistribution, binary-weighted switched-capacitor array for producing the analog output for comparison with the analog input signal. A second switched-capacitor DAC is employed to develop error correction signals to be combined with the analog signal from the A/D conversion DAC. The conversion DAC array is connected to one input terminal of the comparator, and the error-correction DAC array is connected to the other comparator input terminal, an arrangement which reduces the number of capacitors required while providing symmetrical capacitance loading of the comparator input circuit.

4 Claims, 2 Drawing Sheets

1

A/D CONVERTER WITH CHARGE-REDISTRIBUTION DAC AND SPLIT SUMMATION OF MAIN AND CORRECTING DAC OUTPUTS

BACKGROUND OF THE INVENTION

1. Field of the Invention

This invention relates to successive-approximation analog-to-digital (A/D) converters. Such converters employ a digital-to-analog converter (DAC) in carrying out the successive-approximation algorithm, and this invention particularly relates to such an A/D converter wherein the DAC comprises a switched-capacitor array together with a further array of capacitors for error-correction.

2. Description of the Prior Art

It has been known for some time to use a DAC with a charge-redistribution binary-weighted switched-capacitor array to perform high-speed, successive-approximation analog-to-digital conversions. It also is known to use error-correction techniques to reduce linearity errors of the weighted capacitor array, thereby to extend the resolution of the A/D converter from about 10 bits to about 16 bits. For example, U.S. Pat. No. 4,399,426 (Tan) discloses an A/D converter having a binary-weighted switched-capacitor DAC array for developing analog signals in response to digital signals from a successive-approximation-register (SAR). The SAR is controlled by the output of a comparator one input terminal of which serves as a summing node for the output of the DAC capacitor array.

The '426 patent referred to above also includes a second binary-weighted switched-capacitor array connected to the above-mentioned comparator summing node for error-correction purposes. This second capacitor array is used in carrying out a calibration algorithm to develop error correction signals to compensate for mismatch of the capacitors of the first (A/D conversion) array. The signals from the two capacitor arrays are combined at the summing node at the comparator input terminal, i.e., in a single-sided configuration. On-board circuitry (circuitry on the IC chip) directs the calibration algorithm to develop and store the error correction signals for the capacitors of the first (A/D) array.

Switched-capacitor charge-redistribution DACs introduce certain errors when the switches are opened. These errors are difficult to eliminate in a single-sided capacitor array configuration, wherein the capacitors of both the A/D conversion array and the capacitors of the error-correction array are connected to a common summing node, i.e., to one comparator input terminal as described in the above-mentioned '426 patent.

Although not shown in the '426 patent, it also is known to connect to the other input terminal of the comparator a dummy capacitor array matching the switched-capacitor arrays connected to the summing node, in order to provide matching symmetry to minimize common mode effects at the comparator input. Such additional dummy capacitor array, when employed with the arrangement of the '426 patent with its A/D conversion and error-correcting capacitor arrays, imposes the constraint of requiring an undesirably large amount of chip area for the capacitors, and in addition produces unwanted reduction in the signal-to-noise ratio due to the magnitude of the total capacitance connected to the comparator input circuit.

SUMMARY OF THE INVENTION

In an embodiment of the invention to be described hereinbelow in detail, there is provided an A/D converter of the successive-approximation type employing groups of switched-capacitors for both a charge-redistribution DAC and for correcting linearity errors due to binary weighting mismatches in the capacitors of that DAC. The switched-capacitors of the new A/D converter are arranged in first and second preferably identical sets of capacitor arrays connected respectively to the two sides of the circuit, i.e., to the two input terminals of the successive-approximation comparator, thereby to obtain the benefits of matching symmetry in the capacitive loading of the comparator input circuit.

Each of these two sets of capacitor arrays comprises, in the presently preferred embodiment, three distinct arrays which have been termed herein (1) the MSB array, (2) the subdac array and (3) the sub/subdac array. Each such triple-set of capacitor arrays includes (in this embodiment) eighteen (18) functionally switchable capacitors, providing a resolution capability of 18 bits.

Bits 1–16 of the first triple-set of capacitor arrays of this A/D converter are used as a 16-bit DAC connected to the non-inverting input terminal of the comparator to carry out a normal successive-approximation sequence for producing a 16-bit digital output signal corresponding to an analog input signal. The other two available bits (nos. 17 and 18) of this first triple array are unused.

On the other side of the circuit, the second triple-set of capacitor arrays is connected to the inverting terminal of comparator 18. Bits 10–18 of these arrays are used during an error-correcting calibration sequence as a 9-bit DAC to develop calibration coefficients for the most-significant bit capacitors of the first triple array, i.e. for the MSB array. These calibration coefficients, once established, are thereafter employed during each A/D conversion cycle to provide linearizing correction of errors which otherwise would occur due to mismatch among the group of MSB capacitors of the first array set. Bits 1–9 of the second triple array are unused.

It will be seen that the switched-capacitors used for carrying out the normal A/D conversion cycle are all connected to one input terminal of the comparator, while the capacitors used for error correction are all connected to the other input terminal of the comparator. It has been found that this split summing-node arrangement is entirely effective in combining the error correction signals with the DAC conversion signals, even though the two capacitor arrays are connected on opposite sides of the comparator input circuit, not to a single summing node as in the above-mentioned '426 patent. This new configuration has important advantages, particularly in reducing the total number of capacitors and thus the required chip area, and also in reducing the total capacitance connected to the comparator input terminals, thereby minimizing the effects of noise by minimizing the attenuation of the signals caused by the presence of capacitance loading of the input circuit.

Other objects, aspects and advantages of the invention will in part be pointed out in, and in part apparent from, the following description of a preferred embodiment of the invention, considered together with the accompanying drawings.

DETAILED DESCRIPTION OF A PREFERRED EMBODIMENT

Figure 1:
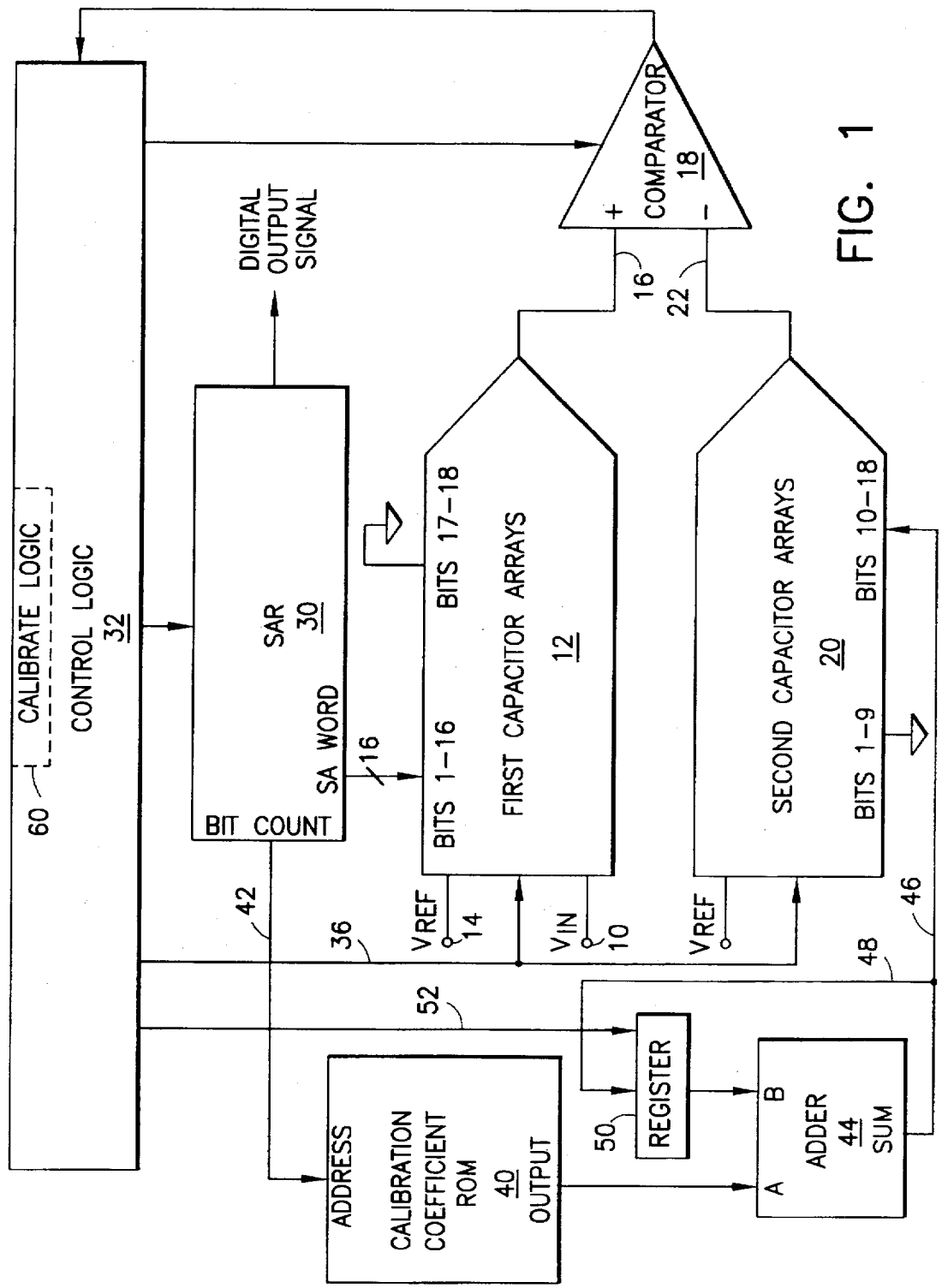
FIG. 1 is a system block diagram showing the principal elements of an A/D converter in accordance with the present invention.
Figure 2:
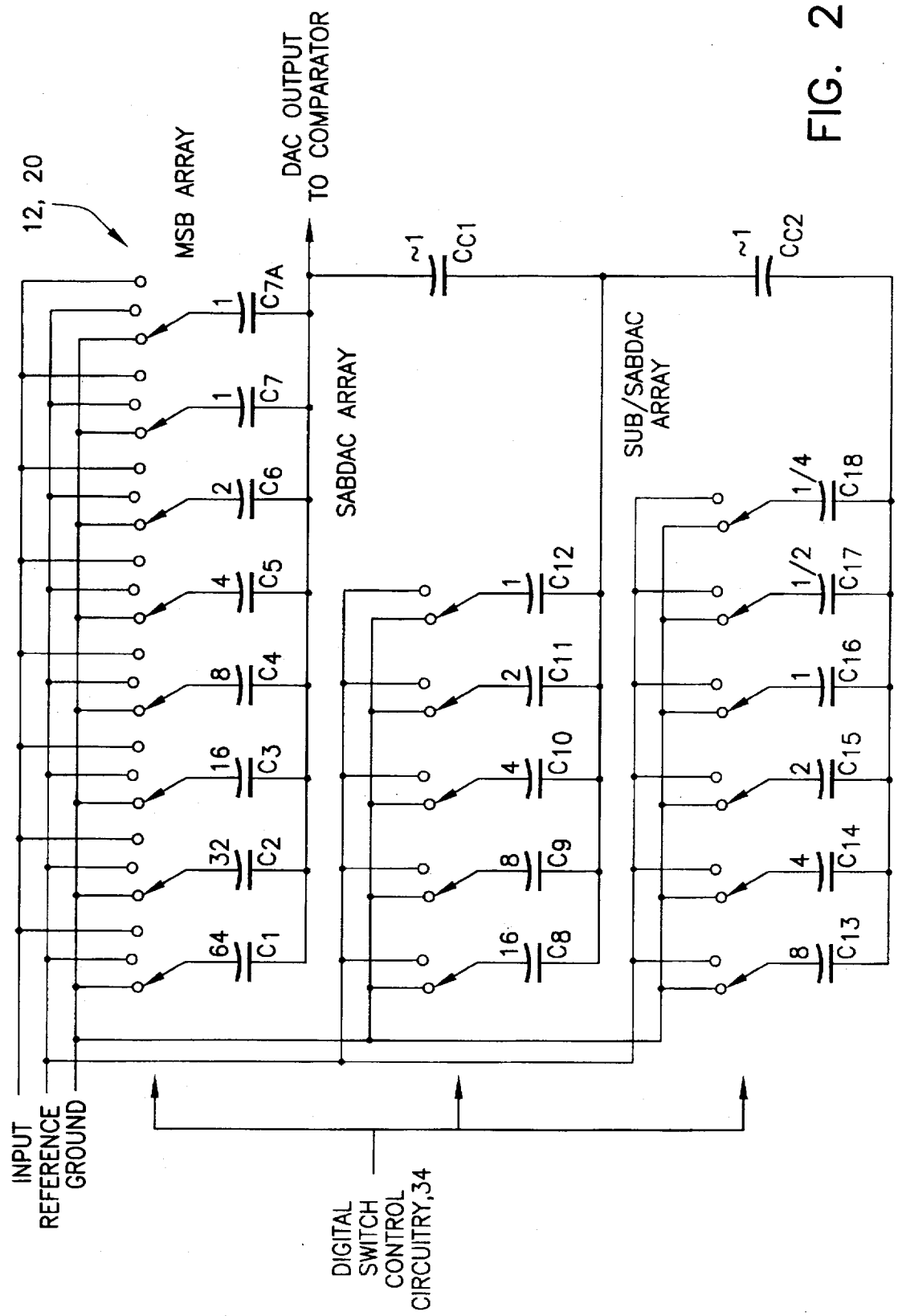
FIG. 2 shows details of one of the two identical triple-sets of capacitor arrays which are connected respectively to the two input terminals of the comparator.

Referring now to FIG. 1, the successive-approximation A/D converter includes an input terminal 10 receiving an analog signal $V_{IN}$ to be converted to a digital signal. This input signal is directed to a first set of switched-capacitor arrays 12 together with a reference voltage $V_{REF}$ from a terminal 14 and a ground connection. As shown in FIG. 2, there are three distinct capacitor arrays in the set of arrays 12, referred to as the (1) MSB array, (2) the subdac array and (3) the sub/subdac array. All three arrays are capacitively coupled together and (returning now to FIG. 1) to the non-inverting input terminal 16 of a comparator 18.

A second set of switched-capacitor arrays 20 is connected to the inverting input terminal 22 of the comparator 18 and is supplied with the reference voltage $V_{REF}$ and a ground connection. The capacitor array set 20 is identical to the first array set 12, so that the two sets of arrays provide symmetrical capacitive loading of the comparator input circuit.

Referring again to FIG. 2, the capacitor arrays 12 provide sixteen (16) operably-switchable capacitive bits C1–C16 employed as a DAC for carrying out the normal successive-approximation A/D conversion algorithm. In this process, a successive-approximation-register (SAR) 30 (FIG. 1) supplies 16-bit successive-approximation (SA) words to the 16-bit DAC of the first set of capacitor arrays 12, and the DAC output is compared with the analog input $V_{IN}$ by the comparator 18. The comparator output for each such comparison is directed to control logic 32 which activates the SAR 30 in performing a sequence of tests to establish the individual bits of the SA word (and the digital output signal) corresponding to the analog input signal. Digital switch control circuitry 34 is provided for both sets of arrays to carry out the necessary switch functions during the conversion process.

The successive-approximation process by which this result is attained is well established in the prior art, and details of various techniques for carrying out such a process are available in numerous publications. For that reason, such details are omitted in this description in order to simplify the presentation.

The second capacitor arrays 20 include a set of switched-capacitor bits C10–C18 which serve as a calibrate DAC to furnish correction signals for any one of the A/D conversion bits C1–C7 turned on by the SAR 30. The calibration coefficients for determining which bits of the calibrate DAC are turned on are stored in a calibration coefficient read-only-memory (ROM) 40 which may for example be a thin-film memory. The computation and storage of these coefficients is, in the disclosed embodiment, carried out at the time of manufacture of the chip. The circuitry for directing the sequences required to carry out this computation therefore is off-chip, and is used once, at probe, to determine the calibration coefficients which are then trimmed into the thin-film ROM 40. During the capacitor switching operations incident to this determination of the calibration coefficients, the digital switch control circuitry 34 is activated by signals controlled by the off-chip circuitry and delivered by the control logic 32 through lines 36.

In the present embodiment, each time the SAR 30 presents a bit of the 16-bit SA word to be tested by the comparator 30, it also produces a bit-count on a line 42 to identify the number of that bit in the 16-bit sequence. With 16 total bits in the successive-approximation word, the bit-count on line 42 will have 4 bits to represent the address of the calibration coefficient for any selected bit. These stored calibration coefficients may for example be 12 bits wide.

While a selected SA word bit is being tested, the corresponding calibration coefficient is directed from the ROM 40 to the A port of an adder 44 to be combined (algebraically) with any other calibration coefficients which already had been found to be necessary for error correction and thus had been stored in the register during the previous test of a higher order bit of the SA word. This sum of calibration coefficients for all bits currently on is directed by a line 46 to the capacitor arrays 20 to develop (through activation of the digital switch control circuitry 34) the corresponding error correction signal from the calibrate DAC. This correction signal is combined with the signal from the A/D conversion DAC (arrays 12) at the comparator 18 for the purposes of determining whether that SA word bit should be turned on. The sum of calibration coefficients also is directed by a line 48 to a register 50 where it is available to be stored.

If the control logic 32 determines to leave on that bit of the SA word then being tested, the sum of calibration coefficients including the one for the tested bit is transferred to the register 48, under control of a signal on a line 52 from the control logic 32, to be combined with other calibration coefficients. If the control logic turns off that bit of the SA word, register 48 is not updated and the calibration coefficient for the currently tested bit is not saved. When all of the SA word bits have been tested, the adder 44 will contain a composite correction signal corresponding to the final SA word. During this process, 9 bits of this composite correction signal (after rounding off the 12-bit summation) are directed to the calibrate DAC in the second comparator arrays 20, i.e., to bits 10–18 of those arrays, which in turn develop an analog correction signal for all bits of the complete SA word being tested. (Calibration coefficients are stored and the addition is done at 12 bits of precision to avoid round-off errors.)

It may be noted that the calibrate DAC in the second arrays 20 includes two additional bits (C17 and C18) corresponding bits of which in the A/D conversion DAC of the upper arrays 12 are unused. These two additional bits of resolution are needed in the calibrate DAC to ¼ of a 16-bit LSB. It may also be noted that C7A plays no part in a conventional successive approximation (SA) algorithm as described, but is included here for input sampling and dynamic error correction which are not subjects of this disclosure. The values of $C_{C1}$ and $C_{C2}$ are fractions close to the unit capacitance, and are calculated to provide continuous binary weighting of C1–C18 in both sets of arrays. More specifically, these coupling capacitors have values to establish $C_8$ as ½ that of $C_7$, and $C_{13}$ as ½ that of $C_{12}$.

The procedure for computing the calibration coefficients for the ROM 40 can for example follow the teachings of H. S. Lee et al in their paper "A Self-Calibrating 15 Bit CMOS A/D Converter", which appeared in the IEEE Journal of Solid-State Circuits, December, 1984. If desired, the calibration process can be directed by on-board circuitry, illustrated in block format at 60, which will carry out that procedure described in the Lee et al paper. The coefficients can for example be calculated automatically whenever the chip is powered up, as suggested in that paper by Lee et al. In such on-board self-calibration, the ROM would be replaced by a random-access-memory (RAM) to accommodate the changes in the computed calibration coefficients. Other changes would be needed in the logic system as would be apparent to those skilled in this art.

Although a preferred embodiment of the invention has been disclosed herein in detail, it is to be understood that this is for the purpose of illustrating the intention, and should not be construed as necessarily limiting the scope of the invention since it is apparent that many changes can be made by those skilled in the art while still practicing the invention claimed herein.

What is claimed is:

1. The method of converting an analog signal to a digital signal by a successive-approximation process carried out by an integrated-circuit (IC) chip aria including the following steps:

supplying bits of a successive-approximation word to a first group of switched capacitors to produce corresponding analog signals;

directing said analog signals to one input terminal of a comparator;

utilizing stored calibration coefficients to develop control signals for a second group of switched capacitors developing analog correction signals for the respective individual bits of said successive-approximation word;

computing said calibration coefficients at the time manufacture of said IC chip;

said calibration coefficients being computed by circuitry located off of said IC chip and operable to activate a sequence of operations of digital switch control circuitry for said second group of switched capacitors;

said sequence of operations producing calibration coefficients for each bit of said successive-approximation word;

developing multi-bit correction signals responsive to each of said calibrate coefficients for each bit of said successive-approximation word which is turned on as a result of carrying out said successive-approximation process;

summing said multi-bit correction signals to develop a composite correction signal for all of the turned-on bits;

applying said composite correction signal to said other comparator input terminal; and directing the output of said comparator to logic means for controlling the successive-approximation processing to determine the bits of the final digital output signal.

2. The method of claim 1 wherein said calibration coefficients are stored in a read-only-memory.

3. The method of claim 1 wherein said multi-bit correction signals are entered into an adder for summing the correction signals.

4. The method of claim 3 wherein the correction signals corresponding to each turned-on bit are summed in said adder and placed in a register for application to said comparator.

* * * * *